US011035890B2

(12) United States Patent
Osa et al.

(10) Patent No.: US 11,035,890 B2
(45) Date of Patent: Jun. 15, 2021

(54) ABNORMALITY DETECTION DATA RECORDING DEVICE

(71) Applicant: Rohm Co., Ltd., Kyoto (JP)

(72) Inventors: Masahiro Osa, Kyoto (JP); Isao Takobe, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 177 days.

(21) Appl. No.: 16/170,293

(22) Filed: Oct. 25, 2018

(65) Prior Publication Data

US 2019/0120882 A1    Apr. 25, 2019

(30) Foreign Application Priority Data

Oct. 25, 2017 (JP) .............................. JP2017-205845

(51) Int. Cl.
*G01R 31/44* (2020.01)
*G01R 19/165* (2006.01)

(52) U.S. Cl.
CPC ....... *G01R 19/16552* (2013.01); *G01R 31/44* (2013.01)

(58) Field of Classification Search
USPC ......................................................... 324/414
See application file for complete search history.

(56) References Cited

U.S. PATENT DOCUMENTS

| 5,576,730 | A * | 11/1996 | Shimada | G09G 3/006 |
| | | | | 324/760.02 |
| 9,224,360 | B2 * | 12/2015 | Heo | G09G 5/006 |
| 9,704,431 | B2 * | 7/2017 | Cho | G09G 3/3225 |
| 10,297,200 | B2 * | 5/2019 | Kim | G09G 3/32 |
| 2006/0279313 | A1 * | 12/2006 | Fujita | G09G 3/006 |
| | | | | 324/760.01 |
| 2009/0013100 | A1 * | 1/2009 | Lee | G06F 13/4286 |
| | | | | 710/30 |

FOREIGN PATENT DOCUMENTS

| JP | 2011-034507 | 2/2011 |
| JP | 2011-070282 | 4/2011 |

* cited by examiner

*Primary Examiner* — Melissa J Koval
*Assistant Examiner* — Joseph O Nyamogo
(74) *Attorney, Agent, or Firm* — Fish & Richardson P.C.

(57) ABSTRACT

[Problem] To provide an abnormality detection data recording device capable of detecting an abnormality and leaving its history.

[Solution] An abnormality detection data recording device includes a first semiconductor integrated circuit device and a second semiconductor integrated circuit device. The first semiconductor integrated circuit device includes an abnormality detection part configured to detect an abnormality of an electronic device in which the abnormality detection data recording device is installed, and a transmission part configured to transmit abnormality detection data indicative of the abnormality detected by the abnormality detection part. The second semiconductor integrated circuit device includes a reception part configured to receive the abnormality detection data by wired communication with the transmission part, and a storage part configured to nonvolatilely store the abnormality detection data received by the reception part.

9 Claims, 7 Drawing Sheets

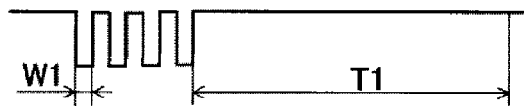
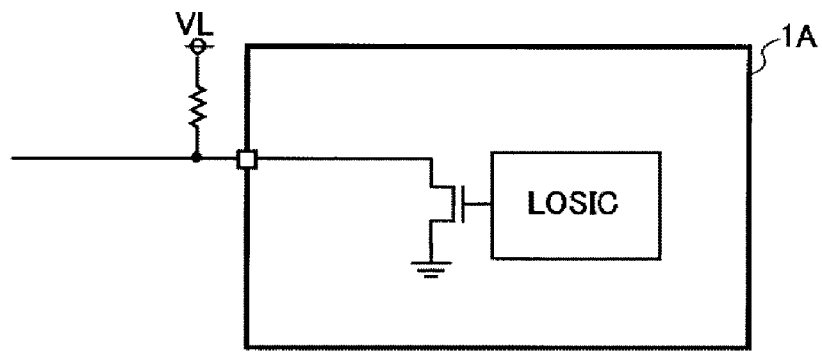
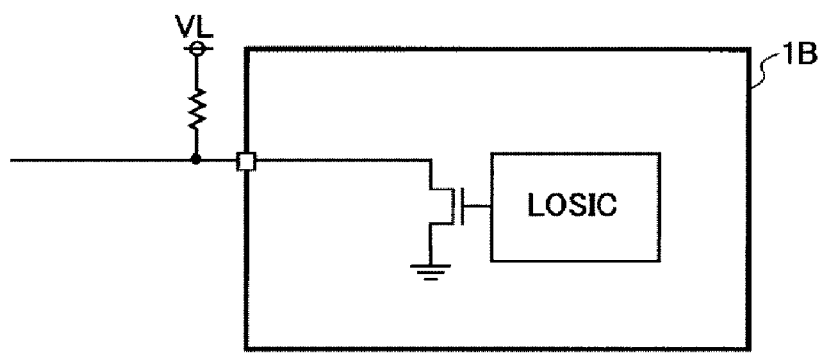

ABNORMALITY DETECTION DATA RECORDING DEVICE

TECHNICAL FIELD

The present disclosure relates to a technique of processing an abnormality detected by, for example, an overcurrent protection function, an overvoltage protection function, or the like.

BACKGROUND

A liquid crystal display device is used not only as an output part of a television receiver or as a monitor of a personal computer but also as an in-vehicle monitor or the like.

For example, when a liquid crystal display device is used as an in-vehicle monitor, the abnormality detection of the liquid crystal display device is particularly important in order to secure the safety of the vehicle.

PRIOR ART DOCUMENTS

Patent Documents

[Patent Document 1] Japanese Patent Laid-Open No. 2011-70282
[Patent Document 2] Japanese Patent Laid-Open No. 2011-34507

SUMMARY OF THE INVENTION

Problem to be Solved by the Invention

However, the conventional liquid crystal display device has a protection function of protecting it when an abnormality is detected, but it has a configuration in which the history does not remain even when the abnormality is detected.

Further, the related art discloses a technique of processing a communication abnormality, but does not disclose a configuration capable of detecting an abnormality and leaving its history.

The present disclosure provides some embodiments of an abnormality detection data recording device capable of detecting an abnormality and leaving its history.

Means for Solving Problem

According to one embodiment of the present disclosure, there is provided an abnormality detection data recording device including a first semiconductor integrated circuit device and a second semiconductor integrated circuit device. The first semiconductor integrated circuit device includes an abnormality detection part configured to detect an abnormality of an electronic device in which the abnormality detection data recording device is installed, and a transmission part configured to transmit abnormality detection data indicative of the abnormality detected by the abnormality detection part. The second semiconductor integrated circuit device includes a reception part configured to receive the abnormality detection data by wired communication with the transmission part, and a storage part configured to nonvolatilely store the abnormality detection data received by the reception part (first configuration).

In the first configuration of the abnormality detection data recording device, the wired communication is 1-wire serial communication (second configuration).

In the second configuration of the abnormality detection data recording device, the abnormality detection data is a plurality of pulse signals, a number of the pulse signals corresponding to a type of the abnormality detected by the abnormality detection part (third configuration).

In the third configuration of the abnormality detection data recording device, the second semiconductor integrated circuit device includes a mask part between the reception part and the storage part, which is configured to mask a pulse whose pulse width is equal to or less than a predetermined value with respect to the abnormality detection data received by the reception part (fourth configuration).

In any one of the first to fourth configurations of the abnormality detection data recording device, the first semiconductor integrated circuit device further includes: an output abnormality detection part configured to detect an output abnormality of the first semiconductor integrated circuit device; and a first terminal kept at a predetermined level when an output abnormality of the first semiconductor integrated circuit device is detected by the output abnormality detection part. The second semiconductor integrated circuit device further includes: a second terminal kept at the predetermined level when an abnormality of the electronic device, in which the abnormality detection data recording device is installed, is detected by the abnormality detection part. The abnormality detection data recording device includes a signal line that connects the first terminal and the second terminal (fifth configuration).

In any one of the first to fifth configurations of the abnormality detection data recording device, the electronic device is a liquid crystal display device, the first semiconductor integrated circuit device is a level shifter IC, and the second semiconductor integrated circuit device is a system power supply IC configured to supply a power supply voltage to at least the level shifter IC (six configuration).

According to another embodiment of the present disclosure, there is provided a semiconductor integrated circuit device including: an abnormality detection part, and a transmission part. The abnormality detection part is configured to detect an abnormality of an electronic device mounted with the semiconductor integrated circuit device, and the transmission part is configured to transmit abnormality detection data indicative of the abnormality detected by the abnormality detection part to a reception part of another semiconductor integrated circuit device by wired communication (seventh configuration).

According to another embodiment of the present disclosure, there is provided a semiconductor integrated circuit device including a reception part and a storage part. The reception part is configured to receive abnormality detection data transmitted from a transmission part of another semiconductor integrated circuit device by wired communication, and the storage part is configured to nonvolatilely store the abnormality detection data received by the reception part (eight configuration)

According to another embodiment of the present disclosure, there is provided a liquid crystal display device including the abnormality detection data recording device of any one of the first to sixth configurations (ninth configuration).

According to another embodiment of the present disclosure, there is provided a liquid crystal display device including the abnormality detection data recording device of any one of the first to seventh configurations (tenth configuration).

Effect of the Invention

According to the present disclosure in some embodiments, it is possible to detect an abnormality and to leave its history by the abnormality detection data recording device disclosed herein.

BRIEF DESCRIPTION OF THE DRAWINGS

FIGS. 4A to 4D are diagrams illustrating examples of abnormality detection data.

FIG. 5 is a diagram illustrating an exemplary modification of the abnormality detection data recording device.

EMBODIMENT FOR THE INVENTION

<Configuration of Liquid Crystal Display Device>

Figure 1:
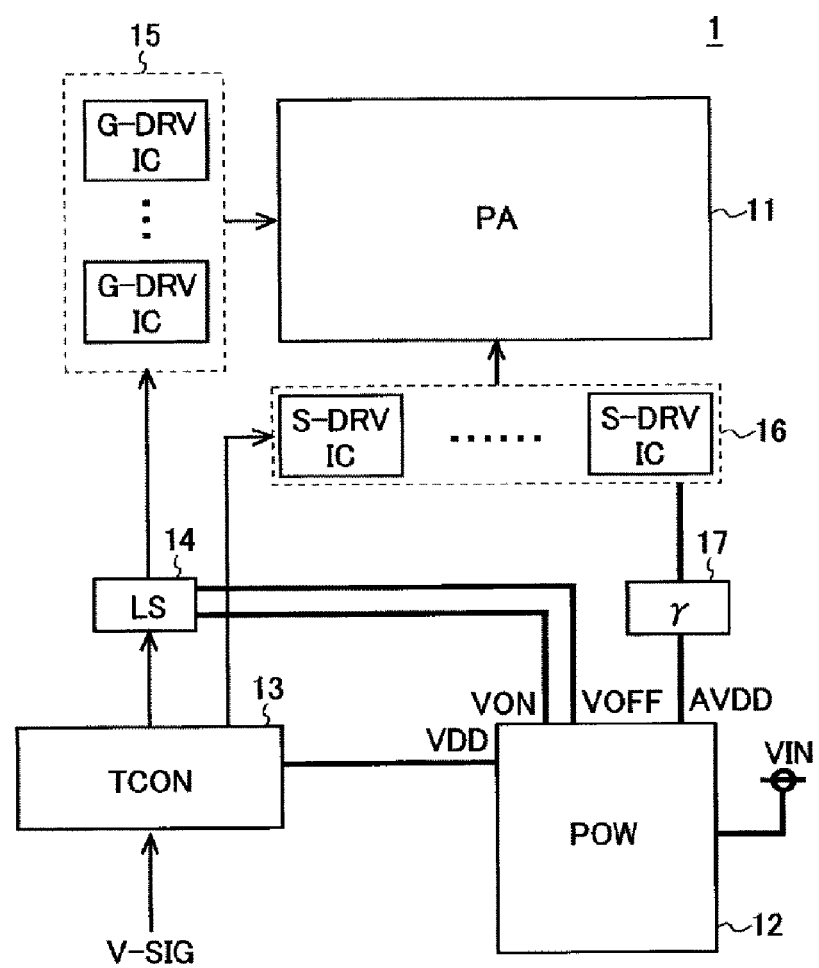
FIG. 1 is a block diagram illustrating a configuration of a liquid crystal display device according to one embodiment of the present disclosure.

First, a configuration example of a liquid crystal display device 1 will be described. FIG. 1 is a block diagram illustrating a configuration of the liquid crystal display device 1. The liquid crystal display device 1 includes a pixel array 11, a system power supply IC 12, a timing control IC 13, a level shifter IC 14, a gate driver 15, a source driver 16, a gamma correction IC 17, and a backlight (not shown).

Figure 2:
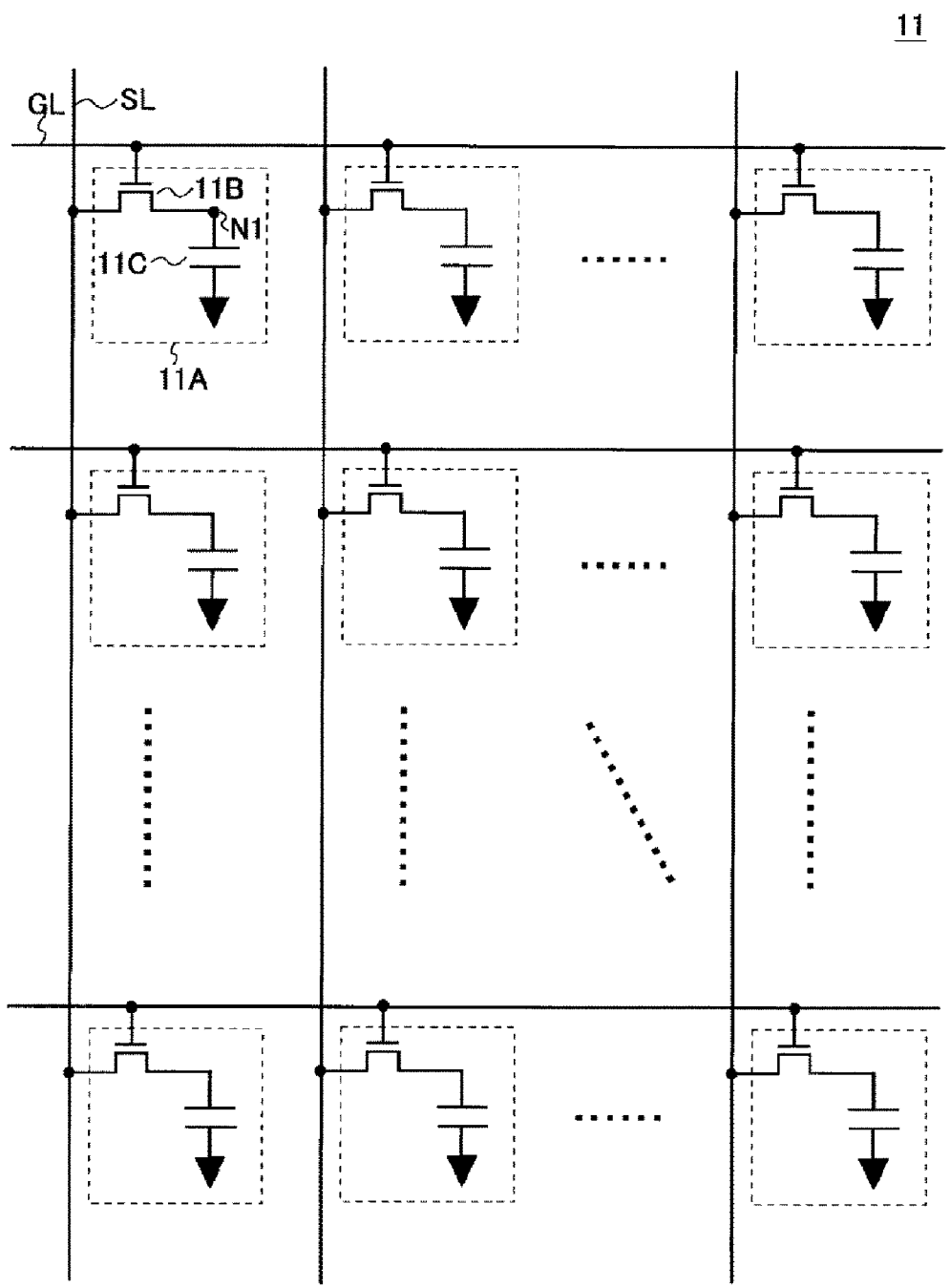
FIG. 2 is a diagram illustrating a configuration example of a pixel array.

As illustrated in FIG. 2, the pixel array 11 includes a plurality of pixel circuits 11A arranged in a plurality of rows and a plurality of columns, a plurality of gate lines GL, which is installed to correspond to the plurality of rows, respectively, and a plurality of source lines SL, which is installed to correspond to the plurality of columns, respectively. One end of each of the gate lines GL is connected to the gate driver 15. One end of each of the source lines SL is connected to the source driver 16.

Each of the pixel circuits 11A has a thin film transistor (TFT) 11B and a liquid crystal cell 11C. Unlike the present embodiment, a switch other than the TFT, which may be controlled to be turned on and off depending on a voltage applied to the gate line GL, may also be used instead of the TFT. A gate of each TFT 11B is connected to a corresponding gate line GL. A source of each TFT 11B is connected to a corresponding source line SL. A drain of each TFT 11B is connected to a common line (not shown) to which a common voltage is applied via a corresponding liquid crystal cell 11C. The liquid crystal cell 11C has two transparent electrodes facing each other and a liquid crystal sealed between the two transparent electrodes.

When the gate line GL has a low level, i.e., when a negative power source voltage VOFF as described hereinbelow is applied to the gate line GL, the TFF 11B is turned off. On the other hand, when the gate line GL has a high level, i.e., a positive power supply voltage VON to be described later is applied to the gate line GL, the TFF 11B is turned on. When the TFF 11B is in an ON state, a voltage of the source line SL is written in a storage node N between the drain of the TFF 11B and the liquid crystal cell 11C, and the voltage written in the storage node N1 is held in the storage node N1 by switching the TFF 11B from the ON state to the OFF state. The light transmittance of the liquid crystal cell 11C varies depending on the voltage written in the storage node N1.

Returning to FIG. 1, the system power supply IC 12 operates in response to the supply of an input voltage VIN, and generates an analog power supply voltage AVDD, a logic power supply voltage VDD, a positive power supply voltage VON and a negative voltage VOFF, respectively, for supplying to each part of the device.

The timing control IC 13 operates in response to the supply of the logic power supply voltage VDD, and controls timing of operation of the gate driver 15 and the source driver 16, for example, based on a video signal V-SIG supplied from a GPU (not shown) in FIG. 1.

The level shifter IC 14 operates in response to the supply of the positive power supply voltage VON and the negative power supply voltage VOFF, shifts the level of a control signal supplied from the timing control IC 13 and then transfers it to the gate driver 15.

The gate driver 15 sequentially selects the plurality of gate lines GL of the pixel array 1 at predetermined time intervals. The gate driver 15 sets the selected gate line GL to a high level.

In the present embodiment, the gate driver 15 has a plurality of gate drivers ICs. A plurality of gate lines GL is allocated to the respective gate drivers ICs, and each gate line GL is connected to one of the gate drivers ICs. Unlike the present embodiment, the gate driver 15 may also be configured by a single gate driver IC.

Furthermore, in the present embodiment, each gate driver IC is mounted on a glass substrate on which the pixel array is formed, by chip on glass (COG). Unlike the present embodiment, each gate driver IC may not be mounted on the glass substrate and may be mounted on a substrate (e.g., a printed circuit board or the like) other than the glass substrate.

The source driver 16 writes a voltage of a level corresponding to the video signal V-SIG to the storage node N1 of each pixel circuit 11A corresponding to the gate line GL selected by the gate driver 15 via each source line SL.

In the present embodiment, the source driver 16 has a plurality of source driver ICs. A plurality of source lines SL is allocated to the respective source drivers ICs, and each source line SL is connected to one of the source drivers ICs. Unlike the present embodiment, the source driver 16 may also be configured by a single source driver IC.

Furthermore, in the present embodiment, each source driver IC is mounted on a glass substrate on which the pixel array is formed, by chip on glass (COG). Unlike the present embodiment, each source driver IC may not be mounted on the glass substrate and may be mounted on a substrate (e.g., a printed circuit board or the like) other than the glass substrate.

The gamma correction IC 17 generates a gamma correction voltage in response to the supply of the analog power supply voltage AVDD from the system power supply IC 12, and supplies the gamma correction voltage to the source driver 16.

The backlight (not shown) irradiates the rear surface of the pixel array 11 with light. The light incident from the rear surface of the pixel array 11 is adjusted in luminance according to the light transmittance of each liquid crystal cell 11C in each pixel of the pixel array 11 and then emitted from the front of the pixel array 11.

<Configuration of Abnormality Detection Data Recording Device>

Figure 3:
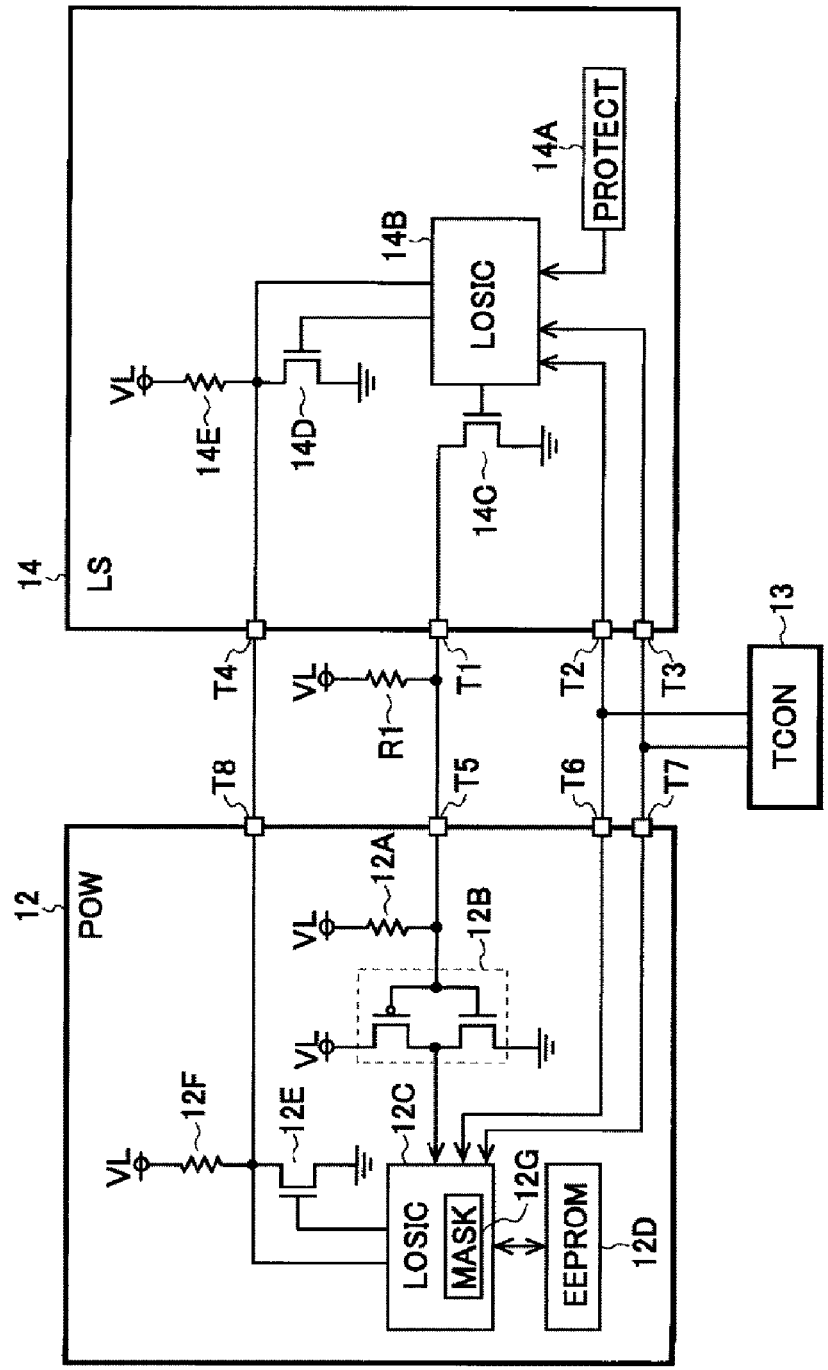
FIG. 3 is a diagram illustrating a configuration example of an abnormality detection data recording device.

The aforementioned liquid crystal display device 1 includes an abnormality detection data recording device illustrated in FIG. 3. The abnormality detection data recording device illustrated in FIG. 3 includes the level shifter IC 14 and the system power supply IC 12. A voltage VL in FIG. 3 may be, for example, a voltage having the same value as the input voltage VIN in FIG. 1.

The level shifter IC 14 includes a protection part 14A, a logic part 14B, negative-channel metal oxide semiconductor (NMOS) transistors 14C and 14D, a pull-up resistor 14E, and external terminals T1 to T4.

The system power supply IC 12 includes a pull-up resistor 12A, an inverter part 12B, a logic part 12C, an electrically erasable programmable read-only memory (EEPROM) 12D, an NMOS transistor 12E, a pull-up resistor 12F, and external terminals T5 to T8. The logic part 12C includes a mask part 12G.

When an abnormality of the liquid crystal display device 1 is detected, the protection part 14A protects the liquid crystal display device 1 by stopping or limiting the output of the level shifter IC 14, or the like. Examples of the abnormality of the liquid crystal display device 1 detected by the protection part 14A may include an overcurrent, an abnormality of the pixel array 11, a poor connection between the liquid crystal display panel including the pixel array 11 and the level shifter IC 14, and the like.

The logic part 14B generates a plurality of pulse signals (abnormality detection data), the number of the pulse signals corresponding to the type of abnormality of the liquid crystal display device 1 detected by the protection part 14A. For example, when using 1 to 4 pulse signals as illustrated in FIGS. 4A to 4D, four types of abnormalities may be expressed. It is desirable that all pulse widths W1 of the pulse signals be substantially the same, and it is also desirable that a predetermined period T1 in which no pulse exists at the end of the pulse signals be provided. The value of the pulse width W1 and the value of the predetermined period T1 are not particularly limited, but for example, the pulse width W1 may be set to 6 μs and the value of the predetermined period T1 may be set to 25 μs. It is also desirable that the interval between adjacent pulses be equal to the pulse width W1. In the present embodiment, the period during which no pulse is generated is set to a high level, but conversely, the period during which no pulse is generated may be set to a low level.

In the case where the level shifter IC 14 is a level shifter IC having outputs of a plurality of channels, for example, the outputs of the plurality (m) of channels are divided into a plurality (n, where n<m) groups according to the magnitude of the output current capability, and if there is a channel that may be in an overcurrent in any group, the overcurrent of the corresponding group may be detected. That is, the type of abnormality of the liquid crystal display device 1 may be classified for each group. On the other hand, an overcurrent of each channel may be detected. That is, the type of abnormality of the liquid crystal display device 1 may be classified for each channel.

The logic part 14B outputs the generated pulse signal (abnormality detection data) to a gate of the NMOS transistor 14C. A source of the NMOS transistor 14C is connected to a ground potential, and a drain of the NMOS transistor 14C is connected to the external terminal T1.

The external terminal T1 is pulled up by an external resistor R1 and also connected to the external terminal T5 of the system power supply IC 12 by an external wiring. The external terminal T5 is pulled up by the pull-up resistor 12A and also connected to an input terminal of the inverter 12B. An output terminal of the inverter 12B is connected to the logic part 12C.

Therefore, the pulse signal (abnormality detection data) is sent from the level shifter IC 14 to the system power supply IC 12 by 1-wire serial communication, and is supplied to the logic part 12C in an inverted form.

The mask part 12G of the logic part 12C masks a pulse whose pulse width is equal to or less than a predetermined value V1 with respect to the pulse signal (abnormality detection data). The predetermined value V1 may be set to a value slightly smaller than the pulse width W1. This makes it possible to remove a noise when the pulse-shaped noise having a narrow width is superimposed on the pulse signal (abnormality detection data).

The logic part 12C writes the pulse signal (abnormality detection data) masked by the mask part 12G in the EEPROM 12D. Accordingly, the abnormality detection data recording device illustrated in FIG. 3 can detect an abnormality and leave its history. The data written in the EEPROM 12D may be the same logic as the pulse signal (abnormality detection data) or may be an inverted logic of the pulse signal (abnormality detection data).

The logic part 12C is connected to the external terminals T6 and T7. The external terminals T6 and T7 are connected to the timing control IC 13 by respective external wirings. Therefore, the timing control IC 13 can read out the abnormality detection data written in the EEPROM 12D. It may also be configured such that an IC other than the timing control IC 13 reads out the abnormality detection data written in the EEPROM 12D. The abnormality detection data read out from the EEPROM 12D may be used for, for example, processing of the entire liquid crystal display device 1 in the event of occurrence of abnormality, analysis of a portion where an abnormality occurs, or the like.

Furthermore, the logic part 14B is connected to the external terminals T2 and T3. The external terminals T2 and T3 are connected to the timing control IC 13 by respective external wirings.

A gate of the NMOS transistor 14D is connected to the logic part 14B and a source of the NMOS transistor 14D is connected to the ground potential. A drain of the NMOS transistor 14D is connected to the external terminal T4 and also connected to the pull-up resistor 14E. Furthermore, a gate of the NMOS transistor 12E is connected to the logic part 12C and a source of the NMOS transistor 12E is connected to the ground potential. A drain of the NMOS transistor 12E is connected to the external terminal T8 and also connected to the pull-up resistor 12F. The external terminal T4 and the external terminal T8 are connected by an external wiring.

When an output abnormality of the system power supply IC 12 is detected by an output abnormality detection part (not shown) which is installed in the system power supply IC 12 and detects an output abnormality of the system power supply IC 12, the logic part 12C turns on the NMOS transistor 12E to set the external terminals T8 and T4 to a low level. In addition, when an abnormality of the liquid crystal display device 1 is detected by the protection part 14A, the logic part 14B turns on the NMOS transistor 14D to set the external terminals T4 and T8 to a low level.

The logic part 14B recognizes an abnormality of the system power supply IC 12 based on the voltage level of the external terminal T4, and performs a necessary protection operation when there is an output abnormality in the system power supply IC 12. Likewise, the logic part 12C recognizes an abnormality of the level shifter IC 14 based on the voltage level of the external terminal T8, and performs a necessary protection operation when there is an abnormality in the liquid crystal display device 1. This makes it possible to perform appropriate protection when an abnormality occurs in both the system power supply IC 12 and the level shifter IC 14.

In the present embodiment, there is one IC that transmits the abnormality detection data, but a plurality of ICs that transmits the abnormality detection data may be used. For example, when ICs that transmit the abnormality detection data are two ICs 1A and 1B, the configurations as illustrated in FIGS. 5 to 7 are considered.

In the configuration illustrated in FIG. 5, the abnormality detection data transmission line of IC 1A and the abnormality detection data transmission line of IC 1B are separated from each other. In this case, it is necessary to install two external terminals for receiving the abnormality detection data in the IC that receives the abnormality detection data.

Figure 6:
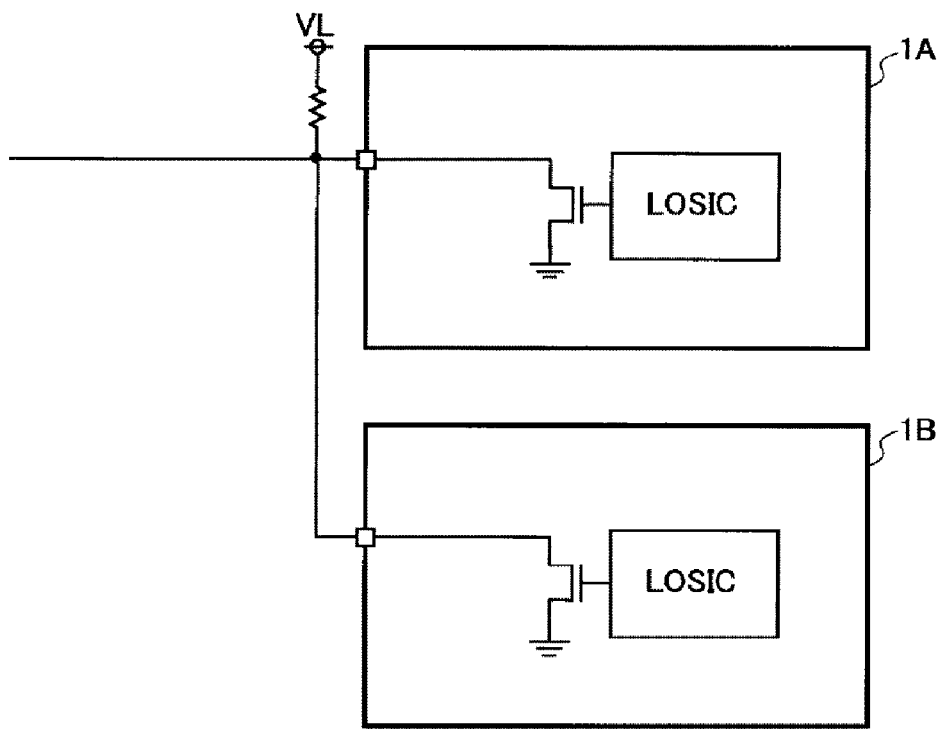
FIG. 6 is a diagram illustrating another exemplary modification of the abnormality detection data recording device.

In the configuration illustrated in FIG. 6, the abnormality detection data transmission line of IC 1A and the abnormality detection data transmission line of IC 1B are common to each other. In this case, only one external terminal is required to receive the abnormality detection data in the IC that receives the abnormality detection data, but it is necessary to include a flag or the like for identifying whether it is data derived from IC 1A or IC 1B in the abnormality detection data.

Figure 7:
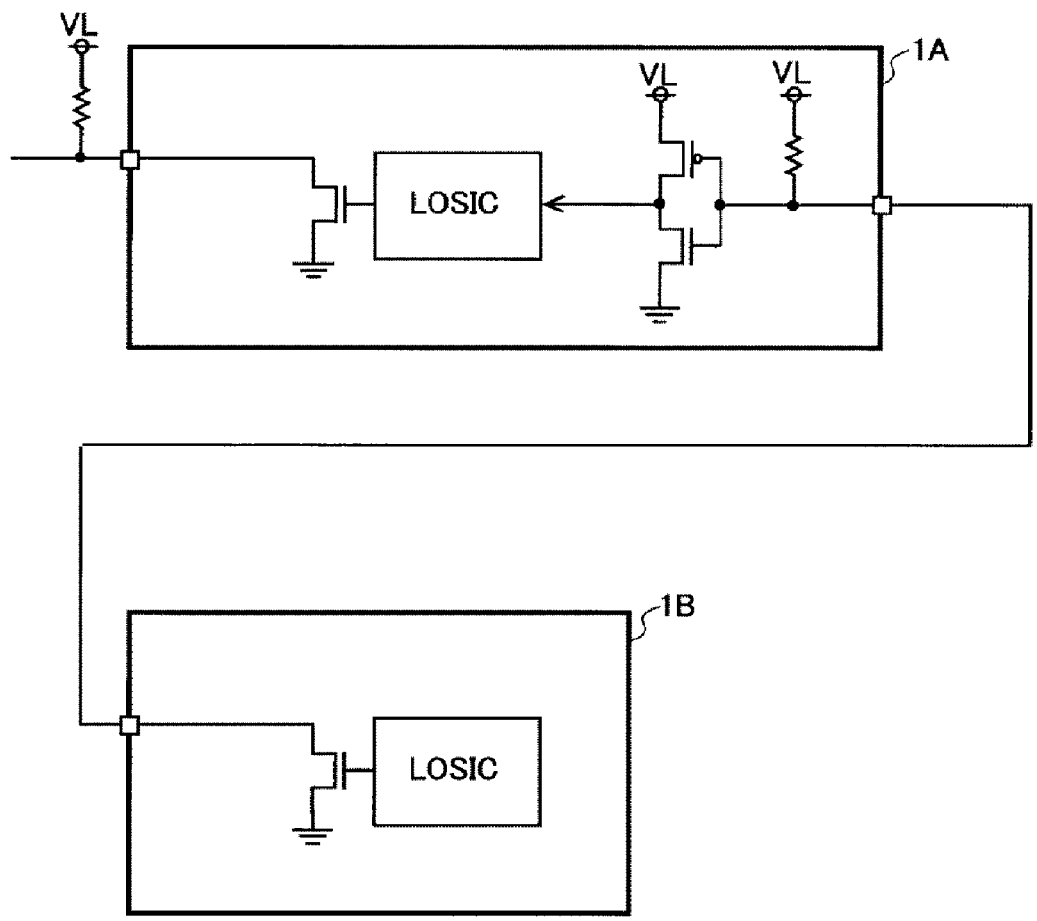
FIG. 7 is a diagram illustrating still another exemplary modification of the abnormality detection data recording device.

In the configuration illustrated in FIG. 7, IC 1A also transmits the abnormality detection data of IC 1B. In this case, only one external terminal is required to receive the abnormality detection data in the IC that receives the abnormality detection data, but it is necessary to include a flag or the like for identifying whether it is data derived from IC 1A or IC 1B in the abnormality detection data.

<Applications of Liquid Crystal Display Device>

Figure 8:
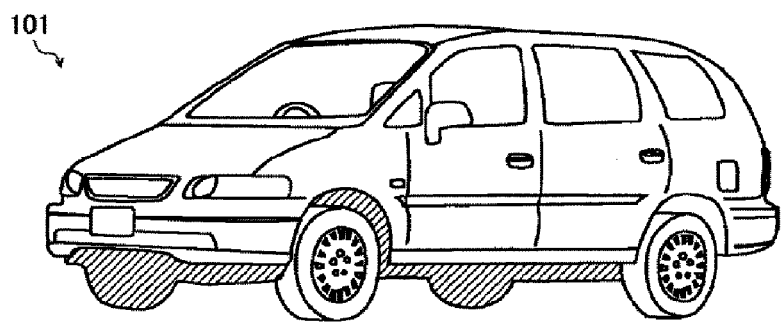
FIG. 8 is an exterior view of a vehicle.
Figure 9:
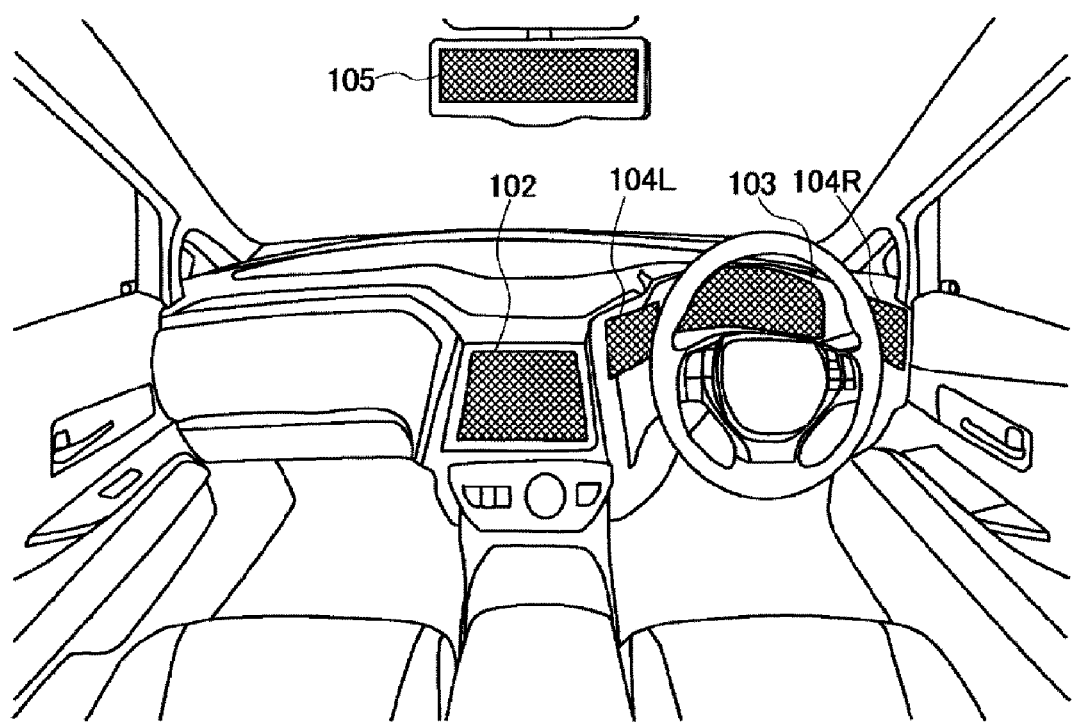
FIG. 9 is a view illustrating an interior of the vehicle.

The aforementioned liquid crystal display device 1 is mounted on, for example, a vehicle 101 illustrated in FIG. 8. The liquid crystal display device 1 may be used as, for example, at least one of a center information display (CID) 102 for performing a map display of car navigation or the like, an instrument cluster 103, display devices 104L and 104R of an electronic side mirror system, and a display device 105 of an electronic rear-view mirror system (see FIG. 9). When the liquid crystal display device is applied to the instrument cluster 103, it may be configured by one liquid crystal display device for performing display of a plurality of instruments, or configured by a plurality of liquid crystal displays, each performing display of at least one instrument.

Notes

Various technical features disclosed herein may be differently modified, as well as the aforementioned embodiment, without departing from the spirit of the present disclosure.

For example, in the aforementioned embodiment, the abnormality detection data recording device is mounted on the liquid crystal display device, but it may be mounted on an electronic device other than the liquid crystal display device.

Furthermore, in the aforementioned embodiment, the abnormality detection data recording device transmits and receives the abnormality detection data by 1-wire serial communication, but it may transmit and receive the abnormality detection data by wired communication other than the 1-wire serial communication.

That is, the aforementioned embodiments are merely illustrative in all aspects and should not be understood as limiting, and the technical scope of the present disclosure is not the description of the aforementioned embodiments but presented by the accompanying claims. Therefore, it is to be understood that it includes all modifications that fall within the meaning and scope of the accompanying claims and their equivalents.

EXPLANATION OF REFERENCE NUMERAL 10 liquid crystal display device
12 system power supply IC
13 timing control IC
14 level shifter IC
101 vehicle

What is claimed is:

1. An abnormality detection data recording device comprising:
    a first semiconductor integrated circuit device; and
    a second semiconductor integrated circuit device,
    wherein the first semiconductor integrated circuit device includes:
        an abnormality detection part configured to detect an abnormality of an electronic device in which the abnormality detection data recording device is installed; and
        a transmission part configured to transmit abnormality detection data, wherein the abnormality detection data is selected from a plurality of pulse signals, and wherein a number of pulses in each respective one of the pulse signals indicates a type of the abnormality detected by the abnormality detection part, and
    wherein the second semiconductor integrated circuit device includes:
        a reception part configured to receive the abnormality detection data by wired communication with the transmission part;
        a mask part configured to mask a pulse whose pulse width is equal to or less than a predetermined value with respect to the abnormality detection data received by the reception part; and
        a storage part configured to nonvolatilely store the abnormality detection data, in which the pulse has been masked by the mask part, received by the reception part.

2. The device of claim 1, wherein the wired communication is 1-wire serial communication.

3. The device of claim 1, wherein the mask part is provided between the reception part and the storage part.

4. The device of claim 1, wherein the first semiconductor integrated circuit device further includes:
    an output abnormality detection part configured to detect an output abnormality of the first semiconductor integrated circuit device; and
    a first terminal kept at a predetermined level when an output abnormality of the first semiconductor integrated circuit device is detected by the output abnormality detection part, and wherein the second semiconductor integrated circuit device further includes:
    a second terminal kept at the predetermined level when an abnormality of the electronic device, in which the abnormality detection data recording device is installed, is detected by the abnormality detection part, and wherein the abnormality detection data recording device includes a signal line that connects the first terminal and the second terminal.

5. The device of claim 1, wherein the electronic device is a liquid crystal display device, the first semiconductor integrated circuit device is a level shifter IC, and the second semiconductor integrated circuit device is a system power supply IC configured to supply a power supply voltage to at least the level shifter IC.

6. A semiconductor integrated circuit device comprising:
an abnormality detection part; and
a transmission part,
   wherein the abnormality detection part is configured to detect an abnormality of an electronic device mounted with the semiconductor integrated circuit device,
   wherein the transmission part is configured to transmit abnormality detection data to a reception part of another semiconductor integrated circuit device by wired communication, wherein the abnormality detection data is selected from a plurality of pulse signals, wherein each one of the respective pulse signals has a different number of pulses, and wherein a number of pulses in each respective one of the pulse signals indicates a type of the abnormality detected by the abnormality detection part,
   wherein a pulse whose pulse width is equal to or less than a predetermined value with respect to the abnormality detection data received by the reception part is masked by a mask part of the another semiconductor integrated circuit device, and
   wherein the abnormality detection data, in which the pulse has been masked by the mask part, received by the reception part is nonvolatilely stored in a storage part of the another semiconductor integrated circuit device.

7. A semiconductor integrated circuit device comprising:
a reception part, a mask part, and a storage part,
   wherein the reception part is configured to receive abnormality detection data transmitted from a transmission part of another semiconductor integrated circuit device by wired communication, wherein the abnormality detection data is selected by the other semiconductor integrated circuit from a plurality of pulse signals, wherein each one of the respective pulse signals has a different number of pulses, and wherein a number of pulses in each respective one of the pulse signals indicates a type of an abnormality detected by an abnormality detection part of the other semiconductor integrated circuit device,
   wherein the mask part is configured to mask a pulse whose pulse width is equal to or less than a predetermined value with respect to the abnormality detection data received by the reception part,
   wherein the storage part is configured to nonvolatilely store the abnormality detection data, in which the pulse has been masked by the mask part, received by the reception part.

8. A liquid crystal display device comprising the abnormality detection data recording device of claim 1.

9. A vehicle comprising the abnormality detection data recording device of claim 1.

* * * * *